United States Patent
Li et al.

(10) Patent No.: US 11,057,159 B2
(45) Date of Patent: Jul. 6, 2021

(54) METHOD AND AN APPARATUS FOR IMPROVING A DETERMINATION OF HARQ-ACK MESSAGES IN A WIRELESS COMMUNICATIONS SYSTEM

(71) Applicant: Hong Kong Applied Science And Technology Research Institute Co., Ltd., Shatin (HK)

(72) Inventors: Nan Li, Fanling (HK); Xiangyu Liu, Shatin (HK); Yuxian Zhang, Fanling (HK); Man Wai Kwan, Shatin (HK); Ho Yin Chan, Kowloon (HK); Kong Chau Tsang, Kowloon (HK)

(73) Assignee: Hong Kong Applied Science and Technology Research Institute Co. Ltd., Shatin (HK)

( * ) Notice: Subject to any disclaimer, the term of this patent is extended or adjusted under 35 U.S.C. 154(b) by 343 days.

(21) Appl. No.: 16/254,964

(22) Filed: Jan. 23, 2019

(65) Prior Publication Data
US 2020/0235864 A1    Jul. 23, 2020

(51) Int. Cl.
*H04L 1/18* (2006.01)
*H04W 72/08* (2009.01)
(Continued)

(52) U.S. Cl.
CPC .......... *H04L 1/1812* (2013.01); *H03M 13/45* (2013.01); *H04L 1/1607* (2013.01);
(Continued)

(58) Field of Classification Search
CPC ... H04L 1/1812; H04L 1/1607; H04L 5/0055; H04W 72/085; H04W 76/28; H03M 13/45
See application file for complete search history.

(56) References Cited

U.S. PATENT DOCUMENTS

| 8,315,185 B2 | 11/2012 | Chan |
| 8,514,956 B2 * | 8/2013 | Yang ..................... H04L 1/1867 375/260 |

(Continued)

FOREIGN PATENT DOCUMENTS

| CN | 101299629 B | 11/2012 |
| CN | 102907034 A | 1/2013 |

(Continued)

OTHER PUBLICATIONS

International Search Report, PCT/CN2019/072952 dated Oct. 14, 2019.

(Continued)

*Primary Examiner* — Chi H Pham
*Assistant Examiner* — Weibin Huang

(57) ABSTRACT

Provided is a method for determining a Hybrid Automatic Repeat Request (HARQ) transmission signal. The method comprises receiving soft bits from a wireless communication physical channel uplink signal, said received soft bits being deemed to comprise HARQ LLRs and soft decoding said HARQ LLRs to output a hard ACK/NACK decision. The method includes processing said HARQ LLRs based on said hard ACK/NACK decision such that the processed HARQ LLRs map to a same or identical constellation point or points if the physical channel uplink signal contains an ACK or NACK transmission signal. The method also includes using said processed HARQ LLRs to determine if the physical channel uplink signal contains an ACK or NACK transmission signal or to determine if the physical channel uplink signal comprises discontinuous transmission (DTX).

19 Claims, 10 Drawing Sheets

(51) Int. Cl.
*H03M 13/45* (2006.01)
*H04W 76/28* (2018.01)
*H04L 1/16* (2006.01)
*H04L 5/00* (2006.01)

(52) U.S. Cl.
CPC ......... *H04L 5/0055* (2013.01); *H04W 72/085* (2013.01); *H04W 76/28* (2018.02)

(56) References Cited

U.S. PATENT DOCUMENTS

| | | | | |
|---|---|---|---|---|
| 8,625,723 | B2 * | 1/2014 | Lee | H04L 25/067 375/341 |
| 8,750,214 | B2 | 6/2014 | Mauritz | |
| 2006/0133290 | A1 | 6/2006 | Lindoff et al. | |
| 2011/0300849 | A1 * | 12/2011 | Chan | H04L 5/0055 455/422.1 |
| 2016/0219572 | A1 | 7/2016 | Oizumi et al. | |

FOREIGN PATENT DOCUMENTS

| | | |
|---|---|---|
| CN | 103201992 A | 7/2013 |
| CN | 105847199 A | 8/2016 |

OTHER PUBLICATIONS

Rehman & Zivic, Iterative Bit Flip Type II Hybrid-ARQ Scheme for Wireless Networks, European Wireless 2011, Apr. 27-29, 2011, Vienna, Austia.

* cited by examiner

METHOD AND AN APPARATUS FOR IMPROVING A DETERMINATION OF HARQ-ACK MESSAGES IN A WIRELESS COMMUNICATIONS SYSTEM

FIELD OF THE INVENTION

The invention relates to a method and an apparatus for improving determination and/or detection of HARQ-ACK messages in a wireless communications system and, more particularly, but not exclusively, to an improved determination and/or detection of HARQ ACK signals in Long Term Evolution (LTE) and LTE-Advanced (LTE-A) physical uplink channels such as the physical uplink shared channel (PUSCH).

BACKGROUND OF THE INVENTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., frequency/time resources). Examples of such multiple-access technologies include time division multiple access (TDMA) systems, frequency division multiple access (FDMA) systems, code division multiple access (CDMA) systems, time division synchronous code division multiple access (TD-SCDMA) systems, orthogonal frequency division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. Examples of telecommunication standards are LTE and LTE-A. LTE is a set of enhancements to the Universal Mobile Telecommunications System (UMTS) mobile standard promulgated by the Third Generation Partnership Project (3GPP). It is designed to better support mobile broadband Internet access by improving spectral efficiency, lowering costs, improving services, making use of new spectrum, and better integrating with other open standards preferably using OFDMA on the downlink (DL), SC-FDMA on the uplink (UL), and, in many cases, using multiple input/multiple output (MIMO) antenna technology.

LTE networks are particularly well suited to handling the high capacity of voice and data carried over wireless communication networks. It is noted that the terminology "LTE" is not universal. "LTE" as used herein is a broad term that, depending on the context, may include the Evolved Universal Terrestrial Radio Access (E-UTRA), Evolved Universal Terrestrial Radio Access Network (E-UTRAN), System Architecture Evolution (SAE) and LTE-A. LTE is sometimes referred to as LTE/SAE. More information on LTE can be found in the standard documents for E-UTRA: 3GPP TS 36.211: "Evolved Universal Terrestrial Radio Access (E-UTRA); Physical channels and modulation;" 3GPP TS 36.212: "Evolved Universal Terrestrial Radio Access (E-UTRA); Multiplexing and channel coding;" 3GPP TS 36.213: "Evolved Universal Terrestrial Radio Access (E-UTRA); Physical layer procedures" the disclosures of which are incorporated herein by reference.

LTE uses orthogonal frequency division multiplexing (OFDM) for radio frequency transmissions in the DL between a transmitter such as a base station (typically referred to as "evolved node B" or eNodeB) and a user/receiver such as a user equipment (UE) (e.g., a mobile communication device such as a cell phone, etc.). In the UL, SC-FDMA is used for transmission between the UE and the eNodeB through the PUSCH. Similar to OFDM, SC-FDMA signals carry different orthogonal frequencies, also known as subcarriers. But in contrast to OFDM, the Discrete Fourier Transform (DFT) of the constellation symbols, rather than the constellation symbols themselves, are sent over the subcarriers. As a result, the constellation symbols are sequentially sent in the time domain, and there is a lower peak-to-average power ratio resulting in lower back-off from peak power to achieve higher power efficiency of the high power amplifier of the transmitter.

In the DL, a data payload is carried by transport blocks which are encoded into codewords which are sent over a DL physical data channel called the Physical Downlink Shared Channel (PDSCH). The scheduling information of the PDSCH codeword(s), including its resource allocation in the subframe and its modulation and coding scheme, is included in the physical control channel, called Physical Downlink Control Channel (PDCCH). Generally, the receiving UE decodes the messages in PDCCH and, where it finds that a PDSCH has been assigned to it, it decodes the PDSCH codeword(s) according to the scheduling information decoded from the PDCCH.

In order to prevent the loss of transport blocks, LTE has adopted the Hybrid Automatic Repeat Request (HARQ) scheme. In the physical layer of E-UTRA, HARQ is implemented both in the UL and the DL. The acknowledgement message in E-UTRA is denoted as HARQ-ACK.

HARQ-ACK may be transmitted by the UE in response to certain PDSCH transmissions and includes one or several acknowledgements, either positive (ACK) or negative (NACK) in response to transport blocks transmitted in the DL. HARQ-ACK may be transmitted on one of the physical channels Physical Uplink Control Channel (PUCCH) or PUSCH. When HARQ-ACK is transmitted in a subframe in which the UE is scheduled for transmission, the HARQ-ACK may be multiplexed or punctured with data and/or other control information and transmitted on PUSCH to the eNodeB.

Different modulation schemes and coding may be used for transmitting subframes of data on PUSCH depending on signal quality and cell usage. Quadrature Phase Shift Keying (QPSK) is commonly used, but in good radio conditions 16 Quadrature Amplitude Modulation (16 QAM) and even 64 QAM may be used which increases data throughput rates, wherein QPSK has 4 constellation points; 16 QAM has 16 constellation points; 64 QAM has 64 constellation points.

For Frequency Domain Duplex (FDD) and for Time Domain Duplex (TDD) ACK/NACK bundling of the HARQ-ACK information comprises one or two bits. ACK/NACK bundling is achieved by acknowledging several transport blocks with one acknowledgement per predefined set of transport blocks. If all the transport blocks in the set are received correctly, the acknowledgement is positive (ACK), otherwise it is negative (NACK). The encoding of HARQ-ACK transmitted on PUSCH is described below.

Each positive acknowledgement (ACK) is encoded as a binary '1', and each negative acknowledgement (NACK) is encoded as a binary '0'. If HARQ-ACK comprises 1-bit of information, i.e., $[O_0^{ACK}]$, it is first encoded according to Table 1 where $Q_m$ is the number of bits per symbol, i.e. $Q_m=2$, 4, and 6 for QPSK, 16 QAM, and 64 QAM, respectively. If HARQ-ACK comprises 2-bits of information, i.e., $[O_0^{ACK}O_1^{ACK}]$, it is first encoded according to Table 2 where $O_2^{ACK}=(O_0^{ACK}O_1^{ACK})$ mod 2.

TABLE 1

Encoding of 1-bit HARQ-ACK

| $Q_m$ | Encoded HARQ-ACK |
|---|---|
| 2 | $[o_0^{ACK} y]$ |
| 4 | $[o_0^{ACK} y\ x\ x]$ |
| 6 | $[o_0^{ACK} y\ x\ x\ x\ x]$ |
| 8 | $[o_0^{ACK} y\ x\ x\ x\ x\ x\ x]$ |

TABLE 2

Encoding of 2-bit HARQ-ACK

| $Q_m$ | Encoded HARQ-ACK |
|---|---|
| 2 | $[o_0^{ACK} o_1^{ACK} o_2^{ACK} o_0^{ACK} o_1^{ACK} o_2^{ACK}]$ |
| 4 | $[o_0^{ACK} o_1^{ACK} X\ X\ o_2^{ACK} o_0^{ACK} X\ X\ o_1^{ACK} o_2^{ACK} X\ X]$ |
| 6 | $[o_0^{ACK} o_1^{ACK} x\ x\ x\ x\ o_2^{ACK} o_0^{ACK} x\ x\ x\ x\ o_1^{ACK} o_2^{ACK} x\ x\ x\ x]$ |
| 8 | $[o_0^{ACK} o_1^{ACK} x\ x\ x\ x\ x\ x\ o_2^{ACK} o_0^{ACK} x\ x\ x\ x\ x\ x\ o_1^{ACK} o_2^{ACK} x\ x\ x\ x\ x\ x]$ |

The "x" and "y" in Tables 1 and 2 are placeholders for scrambling the HARQ-ACK bits in correlation with 3GPP TS 36.211, in a way that maximizes the Euclidean distance of the modulation symbols carrying HARQ-ACK information. In particular "x" will be transmitted as '1' after scrambling, i.e. the last $Q_m$-2 bits mapped on a modulation symbol are all '1's. As a result, the HARQ-ACK is mapped only on the four corners of the constellation.

The HARQ-ACK information is transmitted in $Q_{ACK}$ bits in Q' symbols, where $Q_{ACK}=Q'Q_m$, and the codeword $q_j^{ACK}$, $j=0, 1, \ldots, Q_{ACK}-1$ is obtained by concatenation of multiple encoded HARQ-ACK. $Q_{ACK}$ is the number of bits and Q' is the number of symbols.

The PUSCH transmission with HARQ-ACK differs from the PUSCH transmission without HARQ-ACK only in that, in some modulation symbols, the data or other control information is punctured and replaced by HARQ-ACK.

When the eNodeB anticipates HARQ-ACK on PUSCH, the modulation symbols are demultiplexed and the HARQ-ACK modulation symbols are used by the HARQ detector. However, it might be that the UE transmits data and/or other control information on PUSCH in response to a UL grant, but that the UE has not received the DL grant for receiving a transmission from the eNodeB. As a consequence, the UE will not transmit HARQ-ACK, but data or other control information in the modulation symbols intended for HARQ-ACK. To send nothing at all, data or other control information, in the modulation symbols intended for HARQ-ACK behaviour, is denoted as Discontinuous Transmission (DTX).

If the eNodeB detects ACK instead of DTX, a so called ACK false detection, the eNodeB will erroneously consider the corresponding DL transport block as correctly received. Since the transport block has not been correctly received by the UE, corresponding data will not be passed to the Medium Access Control (MAC) layer and from the MAC layer to the Radio Link Control (RLC) layer. Data will hence be missing in the RLC layer. This will cause ARQ retransmissions in the RLC layer which introduce delay and possibly large retransmissions and hence is very undesirable. Also, if a NACK is detected erroneously that in reality is DTX, the eNodeB will retransmit the packet in such a way that the UE will not be capable of decoding it. It is thus a problem for the HARQ-ACK detector for PUSCH in the eNodeB, if it cannot distinguish between data and HARQ-ACK signals and decode the correct HARQ-ACK message if present.

The channel decoders for the PUSCH codeword and for the ACK/NACK information are different. Generally, the channel decoder for the PUSCH codeword disregards ACK/NACK coded symbols when decoding the PUSCH data. The channel decoder for the ACK/NACK information ("ACK/NACK decoder" hereinafter) extracts only the ACK/NACK symbols for decoding or what it deems to be the ACK/NACK symbols.

As already indicated, a problem arises when the UE is not aware of the presence of the PDSCH assigned to it if it fails to decode the PDCCH successfully. In this case the user equipment will not generate ACK/NACK information and its PUSCH will contain data only. This situation has been well recognized and the UE response in such case is DTX, that is, neither an ACK nor a NACK signal is transmitted to the eNodeB. Since the eNodeB has no prior knowledge of whether the UE has failed to detect the PDCCH, it expects or deems, as already explained, that the symbols of the predetermined positions are ACK/NACK symbols and extracts them for the ACK/NACK decoder to decode. If the eNodeB disregards the possibility of DTX, either an ACK or NACK message will be returned by the ACK/NACK decoder to a higher layer upon the decoding of the extracted symbols, which are, in fact, data. In general, both ACK and NACK messages are equally likely to be returned.

The consequence of wrongly detecting a DTX as an ACK ("DTX-to-ACK event" hereafter) is more adverse to the system performance than wrongly detecting a DTX into a NACK ("DTX-to-NACK event" hereafter) and it is desirable to take a more conservative approach in returning an ACK, in order to maintain the DTX-to-ACK probability, which is also referred to as the false alarm rate (FAR). Under this rationale, Section 8.2.4 of 36.104 and Section 8.2.3 of 36.141 prescribe the requirement that the DTX-to-ACK probability should not exceed 0.01, while maintaining certain performance in detection of a true ACK under certain conditions.

The eNodeB receiver should be so designed that it can, upon the reception of the PUSCH, detect a DTX event and return DTX or NACK to the higher layer. However, in some cases, if the channel condition is very bad, a certain probability of DTX-to-ACK rate is allowed. So when a DTX event occurs, in order to maintain the DTX-to-ACK probability at a target level, the NodeB has to overcome the difficulties arising from reasons such as noise and multipath fading in the wireless communication system.

A common approach to design such a receiver is to adopt a threshold-based algorithm for determination of the presence of a HARQ-ACK (ACK/NACK) signal. That is, in general, the decision variable of the output of a soft channel decoder for the ACK/NACK information is compared with one or more thresholds. These thresholds partition the range of output into multiple intervals. HARQ-ACK (ACK/NACK) signal or DTX signal is determined depending on the interval the value or the magnitude falls into and this, in turn, depends on the actual design of the decoder. The challenge of these methods is to design the computation of these thresholds. Existing methods for computing a threshold to achieve a target FAR include those which are implemented in the Constant FAR (CFAR) detector, a dynamic threshold detector proposed by Philips, and a selective threshold ACK/NACK detector proposed by Huawei Technologies. All of these methods relate to the use of a channel estimate and a noise/signal-to-interference-plus-noise ratio (noise/SINR) from reference symbols in an SC-FDMA frame. Thus the channel estimator and/or the noise estimator are used for determining whether an ACK or NACK transmission has been made from the reference signal.

The threshold is the only criteria to determine if the signal is HARQ-ACK (ACK/NACK) signal or DTX signal. Also it generally does not take into account the channel estimation error. Hence the robustness to channel variations of the resulting threshold determination is undermined and a higher margin in the threshold is needed to comply with a given error requirement, thus increasing the misdetection rate.

US2006/0133290 is directed to improving HARQ-ACK detection in a UE by estimating the probability of a DTX and then calculating a minimum acknowledgement signal threshold for the UE using the estimated probability. A detected signal is determined to be an ACK signal or not based on the minimum acknowledgement threshold.

The foregoing methods for computing the ACK/NACK threshold utilize the channel and noise estimates based on the reference signal symbols to generate the threshold value. However, there are certain drawbacks in using the above estimates. For example, the computed threshold and the decision variable computed from the predetermined positions of the ACK/NACK signal which will be compared with that computed threshold will be from different stages of the decoding process at the eNodeB, and so the amount of error that has been introduced into the computation of the threshold and the decision variable of the ACK/NACK signal would lead to inaccuracy and hence it may not be appropriate to compare the computed threshold directly with the decision variable of the ACK/NACK signals. When the channel condition is bad, the decision variable of ACK/NACK and DTX overlap for a large region. So only using the method of the above described threshold is a risky way to determine whether the signal is ACK/NACK or DTX.

CN105847199 relates to ACK/NACK/DTX detection on a PUSCH. If DTX detection is required, ACK/NACK bit sequences are reconstructed to a reconstructed bit sequence. A DTX status threshold is calculated based on a soft bit sequence and the reconstructed bit sequence multiplied by a factor then ACK/NACK/DTX status is determined.

CN101299629 relates to a constellation mapping method. The method maps ACK, NACK and DTX to different positions in the constellation map for eliminating the format confusion in the constellation map mapping and for improving the capacity of the physical control channel.

"Iterative Bit Flip Type-II Hybrid-ARQ Scheme for Wireless Networks, Institute for Data Communications Systems, University of Siegen, European Wireless 2011, Apr. 27-29, 2011, Vienna, Austria (ISBN 978-3-8007-3343-9) relates to a HARQ scheme for wireless networks. The scheme includes iterative bit-flipping steps. In a first iteration, the least reliable bit (in L-values, LLR) is flipped. In a second iteration, the second least reliable bit is flipped. In a third iteration, both the first and the second least reliable bits are flipped. This process continues with the next bit-flip combinations till a threshold number of iterations have been performed.

Applicant's own U.S. Pat. No. 8,315,185, the content of which is incorporated herein by reference, relates to ACK/NACK detection in an LTE wireless communication system where the ACK/NACK detector has a soft decoder and a decision-maker. A threshold value is used to determine if the transmitted signal from the UE contains an ACK or NACK transmission if the threshold value is met. If the threshold value is not met, the transmission is determined to be DTX.

In the method of comparing whether a decision variable for the ACK/NACK/DTX exceeds a DTX threshold where the threshold is calculated according to the FAR, if the decision variable exceeds the DTX threshold the signal can be determined as ACK/NACK, otherwise it will be determined as DTX. However, since the distributions of ACK/NACK and DTX vary considerably with SNR then, if SNR is low, the distribution of the ACK/NACK decision variable and DTX decision variable will overlap and thus the decision will seriously suffer performance degradation due to the bad channel conditions. Incorrect detection of the ACK/NACK/DTX signal leads to waste of resources for retransmission or loss of the data packet as hereinbefore described.

Thus, there remains a need for improved HARQ-ACK determination/detection in LTE communication systems and discrimination between ACK/NACK and DTX.

OBJECTS OF THE INVENTION

An object of the invention is to mitigate or obviate to some degree one or more problems associated with known methods of determining/detecting HARQ-ACK messages in wireless communication systems.

The above object is met by the combination of features of the main claims; the sub-claims disclose further advantageous embodiments of the invention.

Another object of the invention is to mitigate or obviate to some degree one or more problems associated with known methods of discriminating between HARQ-ACK and DTX in wireless communication systems.

One skilled in the art will derive from the following description other objects of the invention. Therefore, the foregoing statements of object are not exhaustive and serve merely to illustrate some of the many objects of the present invention.

SUMMARY OF THE INVENTION

In a first main aspect, the invention provides a method for determining a Hybrid Automatic Repeat Request (HARQ) transmission signal; the method comprising the steps of: receiving soft bits from a wireless communication physical channel uplink signal, said received soft bits comprising or being deemed to comprise HARQ LLRs; soft decoding said HARQ LLRs to output a hard ACK/NACK decision; processing said HARQ LLRs based on said hard ACK/NACK decision such that the processed HARQ LLRs map to a same or identical constellation point or points if the physical channel uplink signal contains an ACK or NACK transmission signal; and using said processed HARQ LLRs to determine if the physical channel uplink signal contains an ACK or NACK transmission signal or to determine if the physical channel uplink signal comprises discontinuous transmission (DTX).

In a second main aspect, the invention provides a receiver for a wireless communication system configured to determine a Hybrid Automatic Repeat Request (HARQ) transmission signal; the receiver comprising: a soft decoder for: (i) receiving soft bits from a wireless communication physical channel uplink signal, said received soft bits comprising or being deemed to comprise HARQ LLRs; and (ii)soft decoding said HARQ LLRs to output a hard ACK/NACK decision; the receiver including a HARQ LLR processing module for processing said HARQ LLRs based on said hard ACK/NACK decision such that the processed HARQ LLRs map to a same constellation point or points if the physical channel uplink signal contains an ACK or NACK transmission signal; and a decision module configured to directly or indirectly use said processed HARQ LLRs to determine if the physical channel uplink signal contains an ACK or NACK transmission signal or to determine if the physical channel uplink signal comprises discontinuous transmission (DTX).

In a third main aspect, the invention provides a method for determining a Hybrid Automatic Repeat Request (HARQ) discontinuous transmission condition (DTX); the method comprising the steps of: receiving soft bits from a wireless communication physical channel uplink signal, said received soft bits comprising or being deemed to comprise HARQ LLRs; soft decoding said HARQ LLRs to output a hard ACK/NACK decision; flipping said HARQ LLRs based on said hard ACK/NACK decision to output flipped HARQ samples, each comprising two flipped HARQ LLRs; and using said processed HARQ samples to determine if the physical channel uplink signal comprises DTX and, if not, outputting hard ACK/NACK decision.

In a fourth main aspect, the invention provides a receiver for a wireless communication system configured to determine a Hybrid Automatic Repeat Request (HARQ) discontinuous transmission condition (DTX); the receiver comprising: a soft decoder for: (i) receiving soft bits from a wireless communication physical channel uplink signal, said received soft bits comprising or being deemed to comprise HARQ LLRs; and (ii) soft decoding said HARQ LLRs to output a hard ACK/NACK decision; a HARQ LLR processing module for: (i) flipping said HARQ LLRs based on said hard ACK/NACK decision to output flipped HARQ samples, each comprising two flipped HARQ LLRs; and (ii) using said processed HARQ samples to determine if the physical channel uplink signal comprises DTX and, if not, outputting hard ACK/NACK decision.

The present invention particularly relates to ACK-NACK detection over PUSCH in an LTE wireless communication system.

The summary of the invention does not necessarily disclose all the features essential for defining the invention; the invention may reside in a sub-combination of the disclosed features.

BRIEF DESCRIPTION OF THE DRAWINGS

The foregoing and further features of the present invention will be apparent from the following description of preferred embodiments which are provided by way of example only in connection with the accompanying figures, of which.

DESCRIPTION OF PREFERRED EMBODIMENTS

Figure 1:
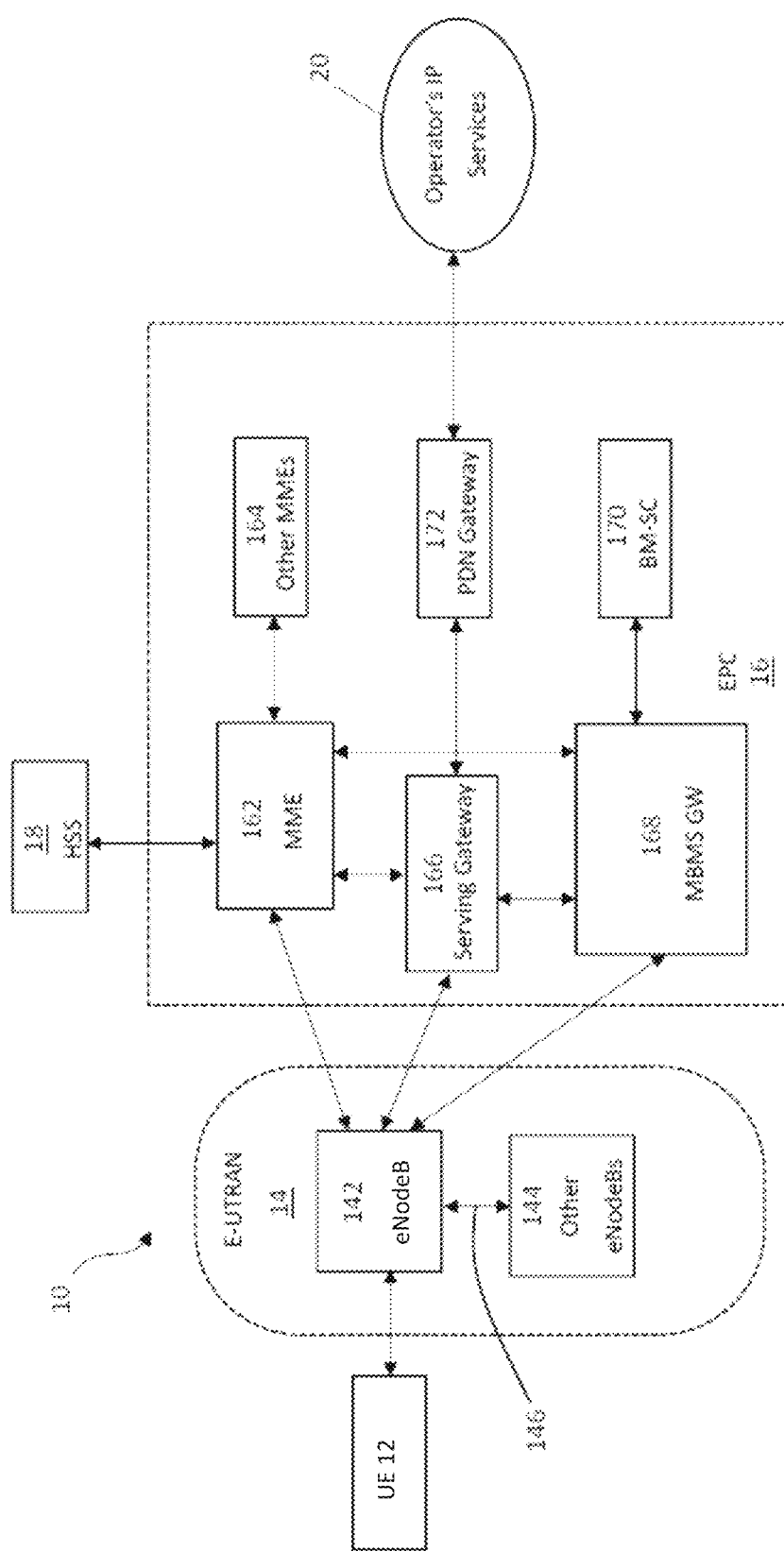
FIG. 1 is a diagram illustrating by way of example only a network architecture for embodiments of the present invention.

The following description is of preferred embodiments by way of example only and without limitation to the combination of features necessary for carrying the invention into effect.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments, but not other embodiments.

It should be understood that the elements shown in the FIGS, may be implemented in various forms of hardware, software or combinations thereof. These elements may be implemented in a combination of hardware and software on one or more appropriately programmed general-purpose devices, which may include a processor, memory and input/output interfaces.

The present description illustrates the principles of the present invention. It will thus be appreciated that those skilled in the art will be able to devise various arrangements that, although not explicitly described or shown herein, embody the principles of the invention and are included within its spirit and scope.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of systems and devices embodying the principles of the invention.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. It is thus regarded that any means that can provide those functionalities are equivalent to those shown herein.

The present invention provides an improved method and apparatus for distinguishing ACK/NACK transmissions from data/DTX in an LTE network.

FIG. 1 is a diagram illustrating, merely by way of example only, an LTE network architecture 10 in which the methods of the present invention can be performed, but it will be understood by one skilled in the art that the methods may be performed in other network architectures. The LTE network architecture 10 of FIG. 1 may be referred to as an Evolved Packet System (EPS) 10. The EPS 10 may include one or more user equipment (UE) 12, an Evolved UMTS Terrestrial Radio Access Network (E-UTRAN) 14, an Evolved Packet Core (EPC) 16, a Home Subscriber Server (HSS) 18, and an Operator's Internet Protocol (IP) Services 20. The EPS 10 can interconnect with other access networks, but for simplicity those entities/interfaces are not shown. As shown, the EPS provides packet-switched services, however, as those skilled in the art will readily appreciate, the various concepts presented throughout this disclosure may be extended to networks providing circuit-switched services.

The E-UTRAN 14 includes an eNodeB 142 and other eNodeBs 144. The eNodeB 142 provides user and control plane protocol terminations toward the UE 12. The eNodeB 142 may be connected to the other eNodeBs 144 via a backhaul (e.g., an X2 interface) 146. The eNodeB 142 may also be referred to herein as a BS, a Node B, an access point, a TRP, a base transceiver station, a radio base station, a radio transceiver, a transceiver function, a basic service set (BSS), an extended service set (ESS), or some other suitable terminology. The eNodeB 142 provides an access point to the EPC 16 for a UE 12. Examples of a UE 12 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, or any other similar functioning device. The UE 12 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The eNodeB 142 is connected to the EPC 16. The EPC 16 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 is the control node that processes the signaling between the UE 12 and the EPC 16. Generally, the MME 162 provides bearer and connection management. All user IP packets are transferred through the Serving Gateway 166, which itself is connected to the PDN Gateway 172. The PDN Gateway 172 provides UE IP address allocation as well as other functions. The PDN Gateway 172 is connected to the Operator's IP Services 20. The Operator's IP Services 20 may include the Internet, an intranet, an IP Multimedia Subsystem (IMS), and a PS Streaming Service (PSS). The BM-SC 170 may provide functions for MBMS user service provisioning and delivery. The BM-SC 170 may serve as an entry point for content provider MBMS transmission, may be used to authorize and initiate MBMS Bearer Services within a PLMN, and may be used to schedule and deliver MBMS transmissions. The MBMS Gateway 168 may be used to distribute MBMS traffic to the eNodeBs (e.g., 142, 144) belonging to a Multicast Broadcast Single Frequency Network (MBSFN) area broadcasting a particular service, and may be responsible for session management (start/stop) and for collecting eMBMS related charging information.

Figure 2:
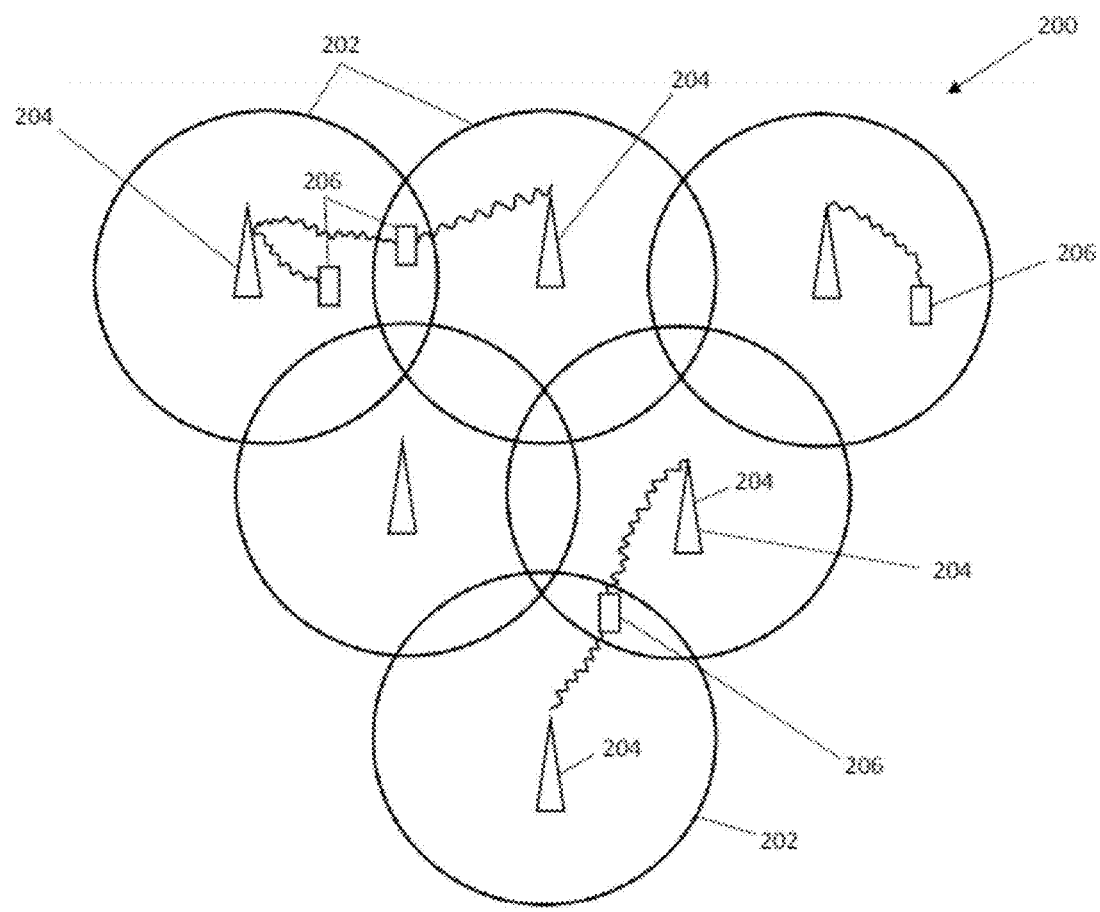
FIG. 2 is a diagram illustrating by way of example only an access network for embodiments of the present invention.

FIG. 2 is a diagram illustrating an example of an access network 200 in an LTE network architecture such as that described with respect to FIG. 1. In this example, the access network 200 is divided into a number of cellular regions (cells) 202. There is no centralized controller in this example of an access network 200, but a centralized controller may be used in some configurations. The eNodeBs 204 may be configured to provide all radio related functions including radio bearer control, admission control, mobility control, scheduling, security, and connectivity to the serving gateway 166. An eNodeB may support one or multiple cells (also referred to as a sector). The term "cell" can refer to the smallest coverage area of an eNodeB and/or an eNodeB subsystem serving a particular coverage area. Further, the terms "eNodeB," "base station," and "cell" may be used interchangeably herein.

The modulation and multiple access scheme employed by the access network 200 may vary depending on the particular telecommunications standard being deployed. In LTE applications, OFDM is preferably used on the DL and SC-FDMA is used on the UL to support both frequency division duplex (FDD) and time division duplex (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

Figures 3, 4:
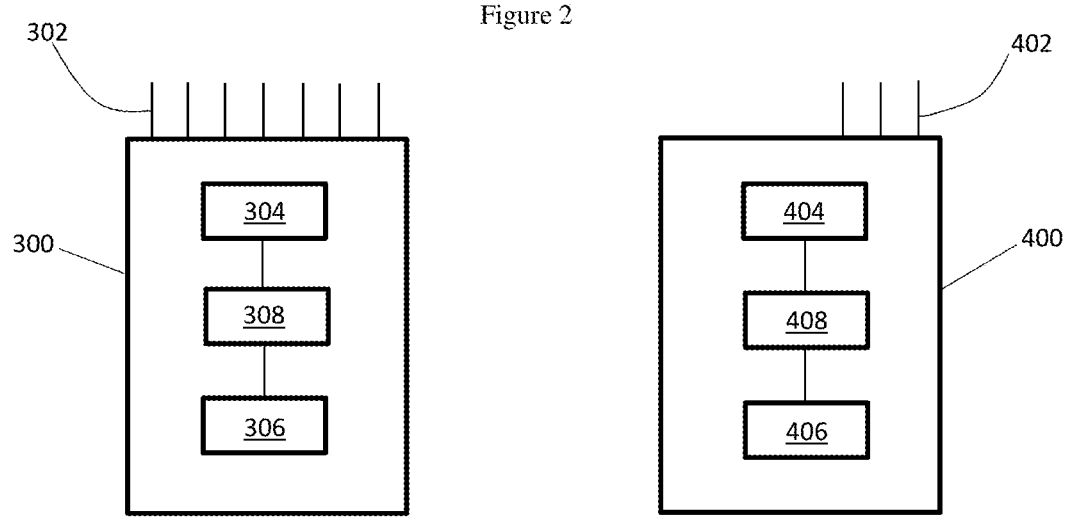
FIG. 3 illustrates a BS or eNodeB for embodiments of the invention.
FIG. 4 illustrates a UE for embodiments of the invention.

FIG. 3 illustrates a basic structure of an eNodeB 300 for implementing the methods of the invention. The eNodeB 300 has at least one or a small number of antennas, but may comprise a massive number of 100 or more antenna elements 302 (only a small number of antenna elements are shown for clarity of the drawing), a communications module 304 for communicating wirelessly with a UE and communicating with other components of a wireless communication system. The eNodeB 300 is also provided with a non-transitory memory 306 storing machine readable instructions for execution by a processor 308. When executing the machine instructions, the processor 308 configures the BS 300 to implement the methods of the invention. The eNodeB 300 includes the features of FIGS. 6-8.

FIG. 4 illustrates a basic structure of a UE 400 for implementing the methods of the invention. The UE 400 comprises at least one antenna 402, but may include multiple antennas 302 or even a massive number of 100 or more antenna elements 402. It is also provided with a communications module 404 for communicating wirelessly with one or more eNodeBs 300. The UE 400 also has a non-transitory memory 406 storing machine readable instructions for execution by a processor 408. When executing the machine instructions, the processor 408 configures the UE 400 to implement the methods of the invention.

Figure 5:
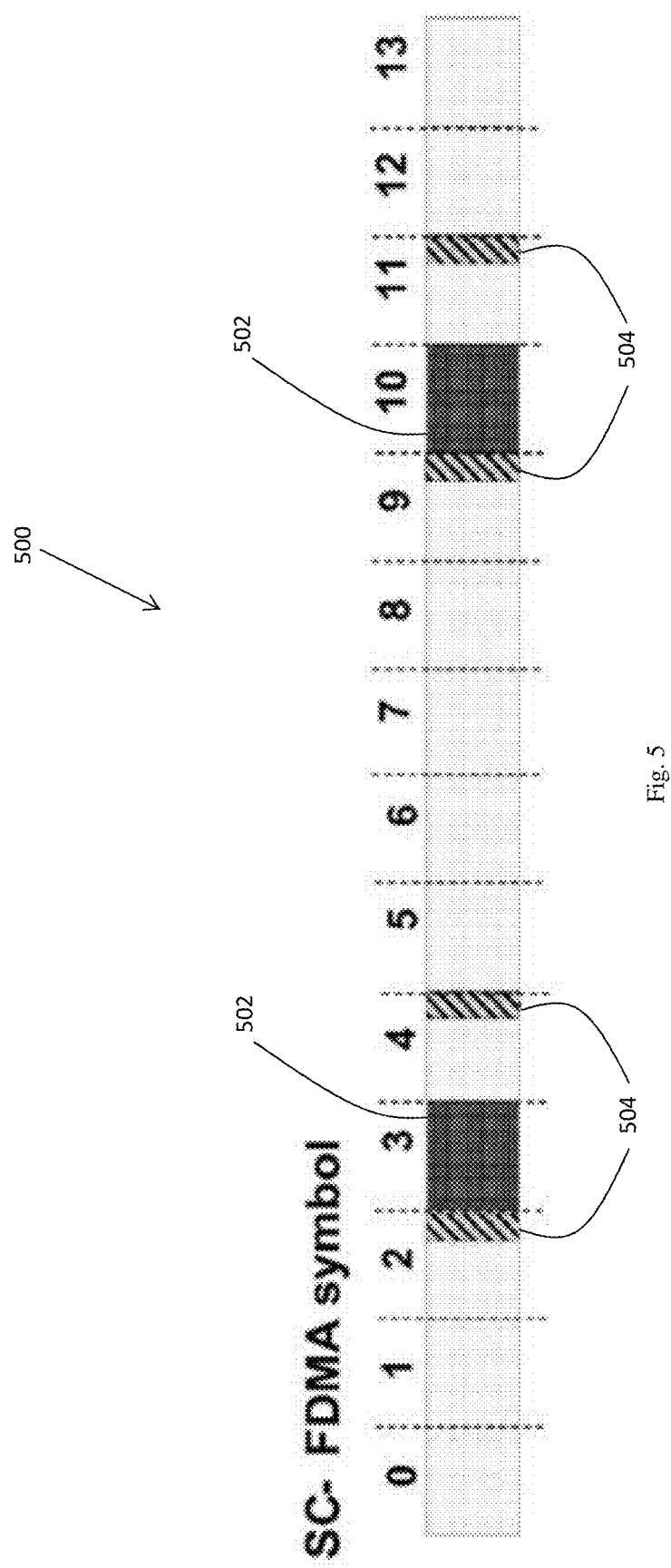
FIG. 5 depicts an SC-FDMA subframe.

In FIG. 5, an SC-FDMA subframe 500 is depicted. This subframe 500 forms part of data being transmitted in the PUSCH between a UE and an eNodeB. As used herein, the expression "base station" or "eNodeB" means any receiver/antenna system that can communicate with a UE in an LTE network. SC-FDMA subframe 500 includes 14 SC-FDMA symbols, numbered 0-13 in FIG. 5. In the exemplary embodiment showing subframe 500, symbols 3 and 10 are reference signal symbols 502 used for channel estimation. These reference signal symbols are essentially the pilot symbols in LTE, which are used for channel estimation for the demodulation of the data SC-FDMA symbols of the subframe. All the other 12 SC-FDMA symbols are data SC-FDMA symbols which contain data symbols from UE to the eNodeB. To avoid ambiguity from "data SC-FDMA symbol," a "data symbol" refers to a constellation symbol which is representing several coded bits. The symbol can be QPSK, 16 QAM, 64 QAM, representing two, four, and six coded bits respectively. A data SC-FDMA symbol, excluding the cyclic prefix, generally consists of as many data symbols as the number of subcarriers assigned to such SC-FDMA symbol. In particular, symbols 0, 6, 7, and 13 are always used solely for transmission of data symbols, and symbols 2, 4, 9 and 11 may also contain ACK/NACK symbols 504 besides the data symbols.

Similar to "data symbol," an "ACK/NACK symbol" refers to a constellation symbol which is representing several coded bits of HARQ information (or ACK/NACK information). The symbol can either be BPSK or QPSK, representing one or two bits respectively. It may be inserted into a data SC-FDMA symbol, by puncturing some data symbols therein as discussed above.

Figure 6:
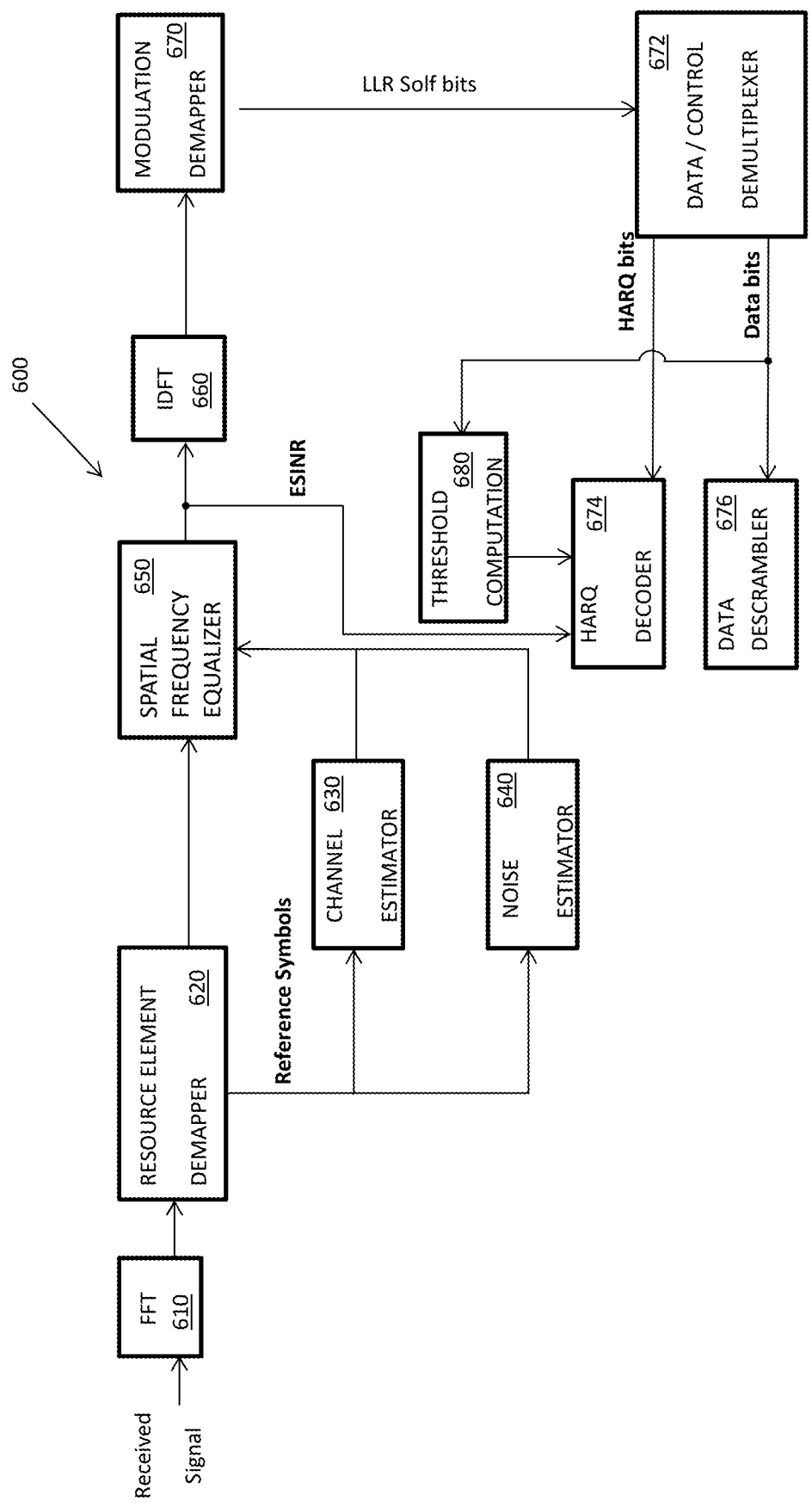
FIG. 6 schematically depicts an eNodeB for receiving a signal through a PUSCH from a UE.

FIG. 6 schematically depicts the structure of an eNodeB 600 for receiving data being transmitted in the PUSCH from a UE. The data is received by an antenna and undergoes analog to digital conversion (not shown). The converted signal is sent to a FFT module 610 which recovers the combinations of subcarriers in the received signal; this data has both real and imaginary components. The FFT output is sent to a resource element demapper 620 which extracts a frequency-domain signal to which data is mapped and outputs reference symbols to a channel estimator 630 and to a noise estimator 640. Data symbols output by the resource element demapper 620 are output to a spatial frequency equalizer 650 which uses the noise estimator 640 output and the channel estimator 630 output to create output compensated for channel phase and magnitude variations.

The signal output by the spatial frequency equalizer is input to IDFT module 660. In this module, the signal is transformed into a time-domain signal by IDFT signal processing. This signal is output to modulation demapper 670.

Modulation demapper 670 performs the function of converting a signal from a given modulation scheme such as QAM (quadrature amplitude modulation) or QPSK (quadrature phase shift key) into corresponding data values. Modulation demapper 670 places bits in essentially the same order as the originating signal. The output of modulation demapper 670 is a serial data bit stream.

Modulation demapper 670 in the present invention is a standard modulation demapper that is commonly used in the communications field, an example of which is described in "Simplified Soft-Output Demapper for Binary Interleaved COFDM with Application to HIPERLAN/2", HPL-2001-246, Hewlett-Packard, 10 Oct. 2001, the disclosure of which is incorporated herein by reference. Its function is to map each input symbol into multiple soft values, each representing the likelihood of a particular coded bit in the symbol. These soft values are regarded as "soft bits"and more particularly log likelihood ratio (LLR) soft bits. A larger positive value indicates that the coded bit is more likely to be bit "0" and a larger negative value indicates that the coded bit is more likely to be bit "1".

The output of modulation demapper 670 is fed into data-control demultiplexer module 672, which then separates the soft bits generated in modulation demapper 670 into two different types. The first type is the "ACK/NACK LLR soft bits," i.e. HARQ bits: information bits which, based on the predetermined positions (e.g., locations 504 in FIG. 5), are expected to contain an ACK or NACK transmission, if present, in the communication from the UE. The data-control demultiplexer module 672 separates the ACK/NACK soft bits by extracting them from their predetermined positions, from the remaining data soft bits. The latter are "pure-data soft bits" which is the second type of output. They are purely data soft bits of the data payload and do not contain any control information. The ACK/NACK soft bits are sent to a HARQ decoder 674 which includes a descrambler 675 (FIG. 7), and the pure data soft bits are sent to both threshold computation module 680, if present, and data descrambler 676. The output of HARQ descrambler 675 comprises descrambled ACK/NACK LLR soft bits which are essentially in the right order, and the output of data descrambler 676 are descrambled data bits which can then be fed into a channel de-interleaver (not shown) to put the data bits into the right order, a rate-dematching module (not shown) to insert zeros for the bits punctured in the rate-matching process at the transmitter and a Turbo decoder (not shown) for further decoding.

Figure 7:
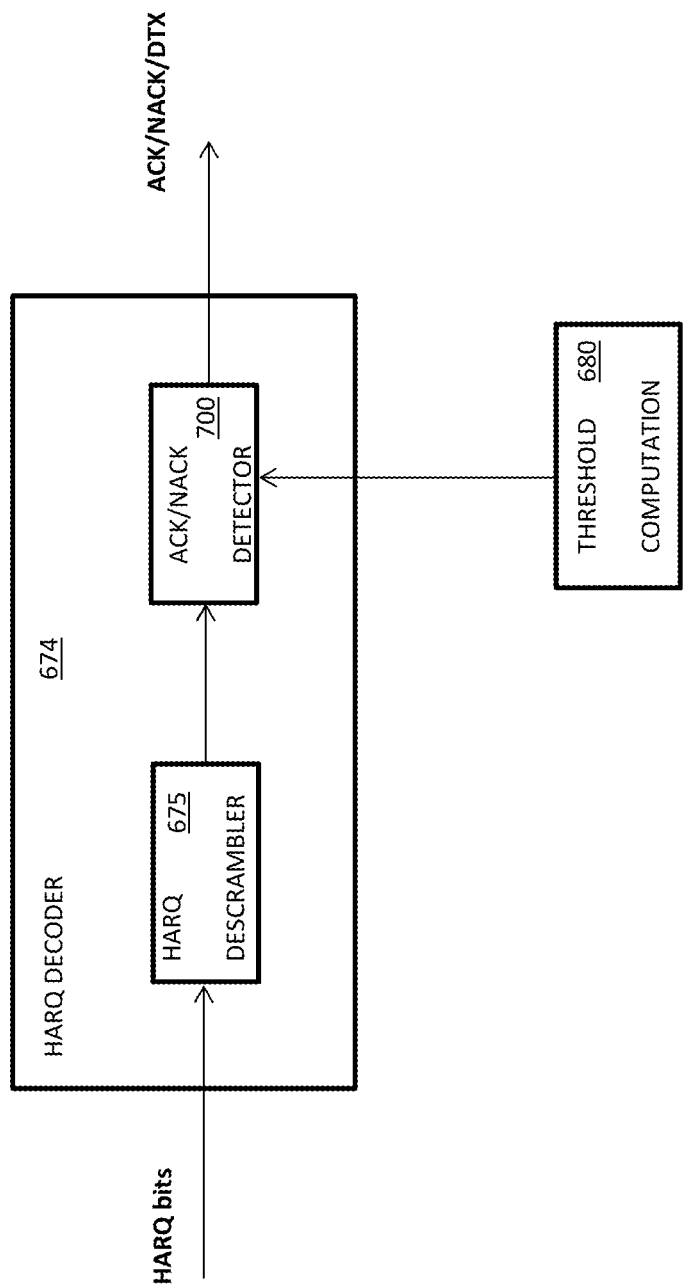
FIG. 7 schematically depicts a HARQ decoder including an ACK/NACK detector with a threshold computation module connected thereto.

FIG. 7 schematically depicts the HARQ decoder 674 including the HARQ descrambler 675 and ACK/NACK detector 700. The ACK/NACK soft bits are sent to ACK/NACK detector 700 after processing in the HARQ descrambler 675.

Figure 8:
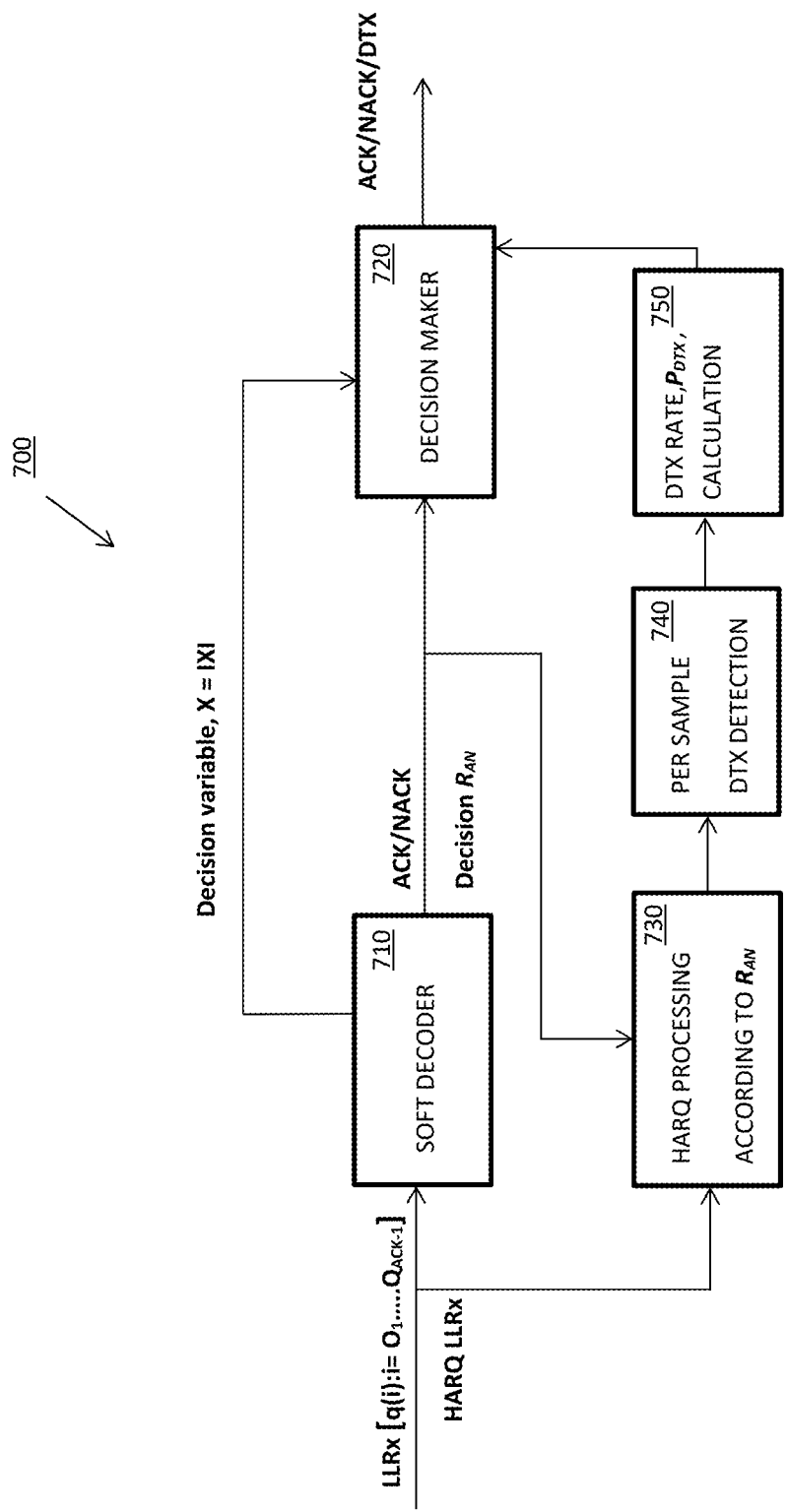
FIG. 8 schematically depicts the HARQ decoder of FIG. 7.

As shown in FIG. 8, ACK/NACK detector module 700 includes soft decoder 710 and a decision-maker module 720 which determines whether a data symbol is ACK/NACK or DTX. This may include a determination based on whether the FAR based threshold (hereinafter DTX threshold $X_{Thr}$)

value determined from the threshold computation module 680 has been met. Calculation of the DTX threshold $X_{Thr'}$ value will be discussed in detail below.

Soft decoder 710 is configured to receive the HARQ soft bits from the wireless communication physical channel uplink signal where said HARQ soft bits may comprise HARQ LLRs or be deemed to comprise HARQ LLRs as the soft decoder 710 is not aware of whether the physical channel uplink signal actually contained any ACK/NACK information from the UE. The soft decoder 710 is arranged to soft decode said HARQ LLRs to output a hard ACK/NACK decision $R_{AN}$.

In soft decoder 710, the following algorithm may be carried out to arrive at a hard ACK/NACK decision $R_{AN}$, although other algorithms for arriving at a hard ACK/NACK decision $R_{AN}$ may be utilized.

First, define Q' as the number of ACK/NACK symbols. In LTE PUSCH, soft decoder 710 includes multiple decoders for different numbers of ACK/NACK information bits (i.e. source bits of the ACK/NACK information). When M represents the number of ACK/NACK information bits, the following three cases arise:

(i) For the case of M=1:

Define $Q_{ACK}$, the number of ACK/NACK soft bits as $Q_{ACK}=Q'$, where Q' is the number of ACK/NACK symbols.

For this case, a soft metric or variable, z, is computed:

$$z = \sum_{i=1}^{Q_{ACK}-1} q(i)$$

where q(i) is the i-th ACK/NACK soft bit. A larger magnitude of z indicates a higher likelihood that ACK/NACK information has been sent, rather than DTX.

(ii) For the case of M=2, $Q_{ACK}=2Q'$. As shown in the calculations below, the soft metric z is defined to be the value of the maximum component of the resulting matrix after the process of linear filtering, which is a matrix multiplication between the matrices as given below:

$$p(j) = \sum_{k=0}^{\lfloor(Q_{ACK}+2-j\vee3)\rfloor-1} q(3k+j)$$

$$[s(0)\ s(1)\ s(2)\ s(3)] = [p(0)\ p(1)\ p(2)]\begin{bmatrix} 1 & -1 & 1 & -1 \\ 1 & 1 & -1 & -1 \\ 1 & -1 & -1 & 1 \end{bmatrix}$$

$$z = s(i^*)$$

$$(\delta_0, \delta_1) = \begin{cases} (0,0), & \text{if } i^* = 0 \\ (1,0), & \text{if } i^* = 1 \\ (0,1), & \text{if } i^* = 2 \\ (1,1), & \text{if } i^* = 3 \end{cases}$$

where $i^* = \arg\max_{i \in [0,1,2,3]} s(i)$, (iii) In the third case, where M>2, the soft metric z is calculated as follows:

$$Q_{ACK} = Q_m \cdot Q'$$

$$B = \left\lceil \frac{Q_{ACK}}{32} \right\rceil$$

$$p(j) = \frac{1}{B} \sum_{k=0}^{\lfloor(Q_{ACK}+31-j)/32\rfloor-1}$$

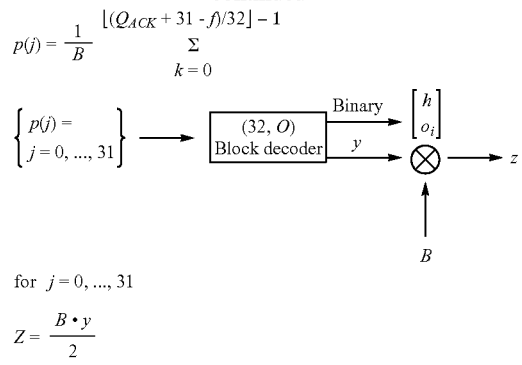

for j = 0, ..., 31

$$Z = \frac{B \cdot y}{2}$$

where the (32,O) block decoder is a Fast Hadamard Transform decoder.

Based on the value of z, the soft decoder 710 determines and outputs an ACK/NACK hard decision $R_{AN}$.

The soft decoder 710 outputs a hard ACK/NACK decision $R_{AN}$, but this decision may disguise a DTX condition. In applicant's prior patent U.S. Pat. No. 8,315,185, a DTX threshold $X_{Thr'}$ value (denoted as T in U.S. Pat. No. 8,315,185) calculated by the threshold computation module is compared to a decision variable to improve detection of HARQ-ACK(ACK/NACK) signal and DTX signal by determining that the transmitted signal from the UE contains an ACK or NACK transmission if the DTX threshold $X_{Thr'}$ value is met. If the DTX threshold $X_{Thr'}$ value is not met, the transmission is determined to be DTX. However, applying the DTX threshold $X_{Thr'}$ in this manner cannot guarantee to discriminate between ACK/NACK on the one hand and DTX on the other hand in all cases. In the case of U.S. Pat. No. 8,315,185, the decision variable is selected as the absolute value of the soft metric or variable z. In the methods of the present invention, it is preferred that a different decision variable is selected as will be described below.

It is known that ACK/NACK samples map to only certain constellation quadrants and more particularly map only to certain points in certain quadrants in the constellation whereas DTX samples map to all quadrants (and points) of the constellation.

The present invention therefore seeks to improve determination of ACK/NACK and/or to improve discrimination between ACK/NACK and DTX.

Referring again to FIG. 8, it can be seen that a HARQ processing module 730 is provided. The HARQ processing module 730 is configured to receive as its inputs the HARQ (ACK/NACK) LLR soft bits, and the hard ACK/NACK decision $R_{AN}$ outputted by the soft decoder 710. The HARQ processing module 730 is configured to process said HARQ LLRs based on said hard ACK/NACK decision such that the processed HARQ LLRs map to a same or identical constellation point or points if the physical channel uplink signal contains an ACK or NACK transmission signal, i.e. to process the HARQ LLRs and the hard ACK/NACK decision $R_{AN}$ such that the processed HARQ samples map only to a specified quadrant or point(s) of the constellation if the processed samples comprise an ACK/NACK message, but still map to points in all quadrants if the processed samples comprise DTX.

Processing of the HARQ samples by the HARQ processing module 730 may comprise flipping the HARQ LLR bits. The bits of the HARQ LLRs are preferably flipped based on the hard ACK/NACK decision $R_{AN}$ outputted by the soft decoder 710 and preferably such that each flipped HARQ sample contains two flipped HARQ LLRs. Flipping may comprise flipping the signs of the HARQ LLR soft bits using an expected bit pattern for the hard ACK/NACK decision $R_{AN}$. Flipping can be achieved by obtaining the expected ACK/NACK bit pattern for the hard ACK/NACK decision $R_{AN}$ and multiplying the bits of the HARQ samples with said expected ACK/NACK bit pattern. This, in effect, flips the signs of the bits of the HARQ samples. A result of such flipping is that each flipped HARQ (ACK/NACK) sample will map to a certain constellation point whose sign is always "+" for different situations. The flipped HARQ (ACK/NACK) samples will map to a point or points in the first quadrant of the constellation whereas the DTX samples will still be spread to points in all of the constellation quadrants.

Figure 9A:
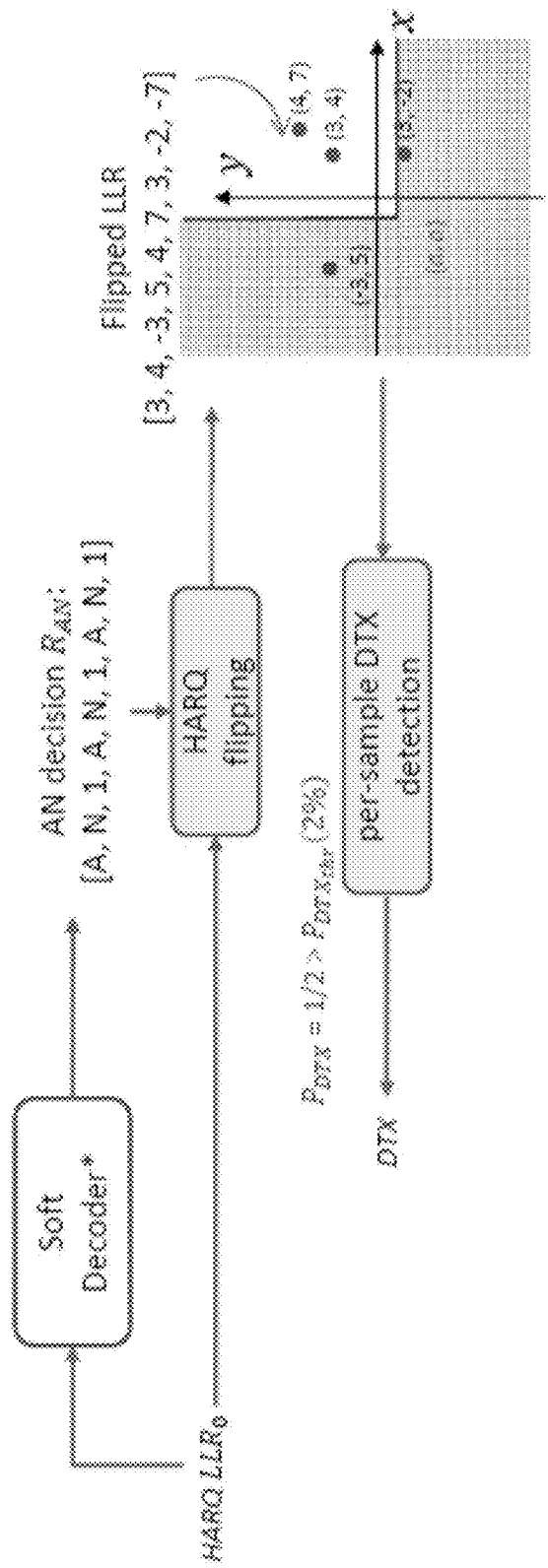
FIG. 9A illustrates HARQ bit flipping to determine DTX.

By way of example, if we have 2 HARQ bits to be decoded with the input bits indicated by:

$$HARQ\ LLR_0 = [3,-4,-3,5,-4,7,3,2,-7]_{2*Q'};$$

then FIG. 9A illustrates that a DTX decision can be made for this example situation because some of the flipped LLR bits fall outside the first (upper right) quadrant of the constellation.

Figure 9B:
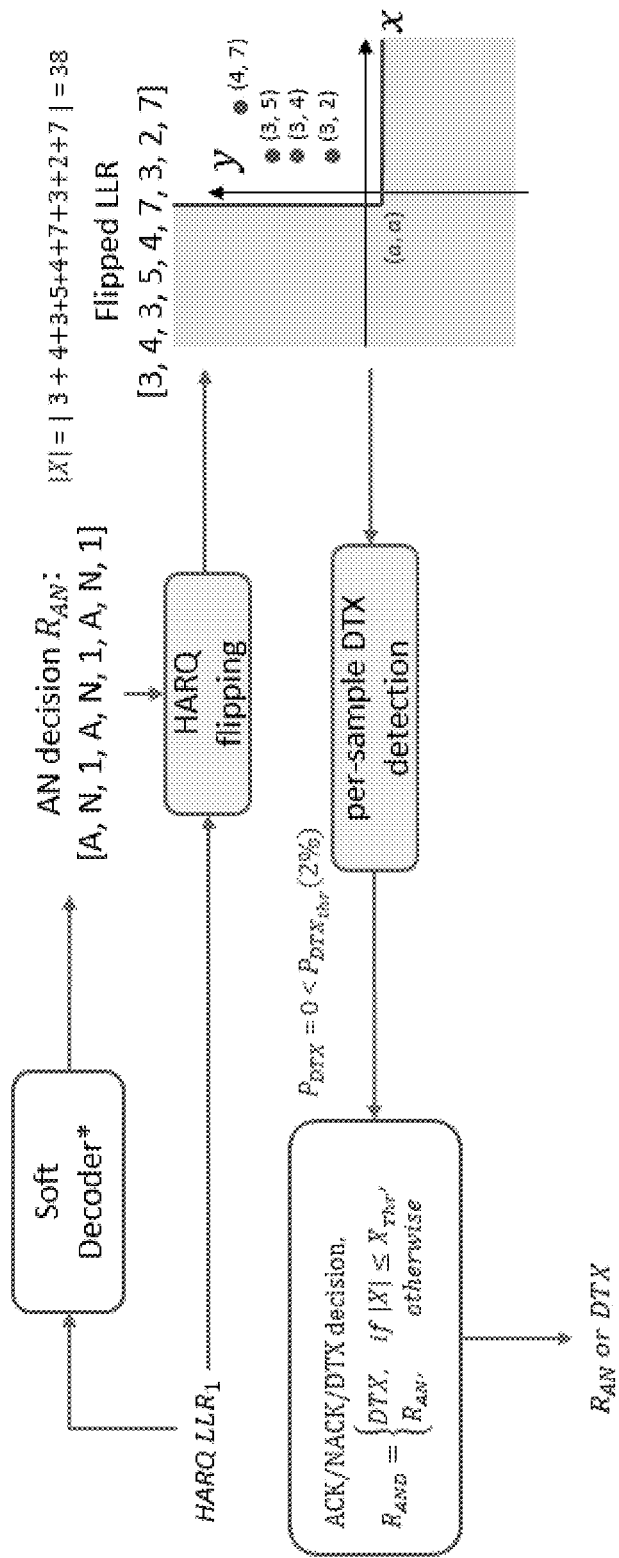
FIG. 9B illustrates HARQ bit flipping where DTX cannot be concluded.

In contrast, if we have 2 HARQ bits to be decoded with the input bits indicated by:

$$HARQ\ LLR_1 = [3,-4,3,5,-4,7,3,-2,7]_{2*Q'};$$

then FIG. 9B illustrates that a DTX decision cannot be concluded as all of the flipped bits fall inside the first (upper right) quadrant of the constellation. In this situation, it is possible to confirm the original soft decoder hard ACK/NACK decision $R_{AN}$ as the output of the decision maker module 720 without further processing, but it is preferred that further processing is performed to reach a final ACK/NACK or DTX decision in accordance with known techniques such as disclosed in applicant's prior patent U.S. Pat. No. 8,315,185 and/or by the following new methods described below as illustrated by FIG. 9B which, in brief, involve further processing the soft decoder hard ACK/NACK decision $R_{AN}$ based on DTX detection to provide an improved determination of ACK/NACK or DTX and/or discrimination between ACK/NACK and DTX.

It will be understood from the foregoing that is possible to use the flipped HARQ samples resulting from the processing of the ACK/NACK LLR soft bits and the hard ACK/NACK decision $R_{AN}$ in the HARQ processing module 730 to determine if the the hard ACK/NACK decision $R_{AN}$ outputted by the soft decoder 710 can be confirmed as the original ACK/NACK decision $R_{AN}$ to be outputted by the decision maker module 720 or should be outputted as DTX. This can be achieved by understanding the constellation mapping of the flipped HARQ samples where, for ACK/NACK, the mapping is always to a first (upper right) constellation quadrant in contrast to DTX where mapping is to all constellation quadrants. More particularly, the flipped HARQ samples can be used to at least determine DTX and, where the flipped HARQ samples do not enable determination of DTX, the ACK/NACK decision $R_{AN}$ is preferably further processed to reach a final ACK/NACK or DTX decision.

Referring again to FIG. 8, there is provided a per sample DTX detection module 740 which receives the flipped DTX HARQ samples as its input. This module 740 is configured to determine, on a per sample basis, whether or not a flipped HARQ sample is DTX. It does this by determining if both flipped LLRs of the HARQ sample are less than min(a, 0) where a is a determined, calculated or selected constellation threshold.

Figure 10A:
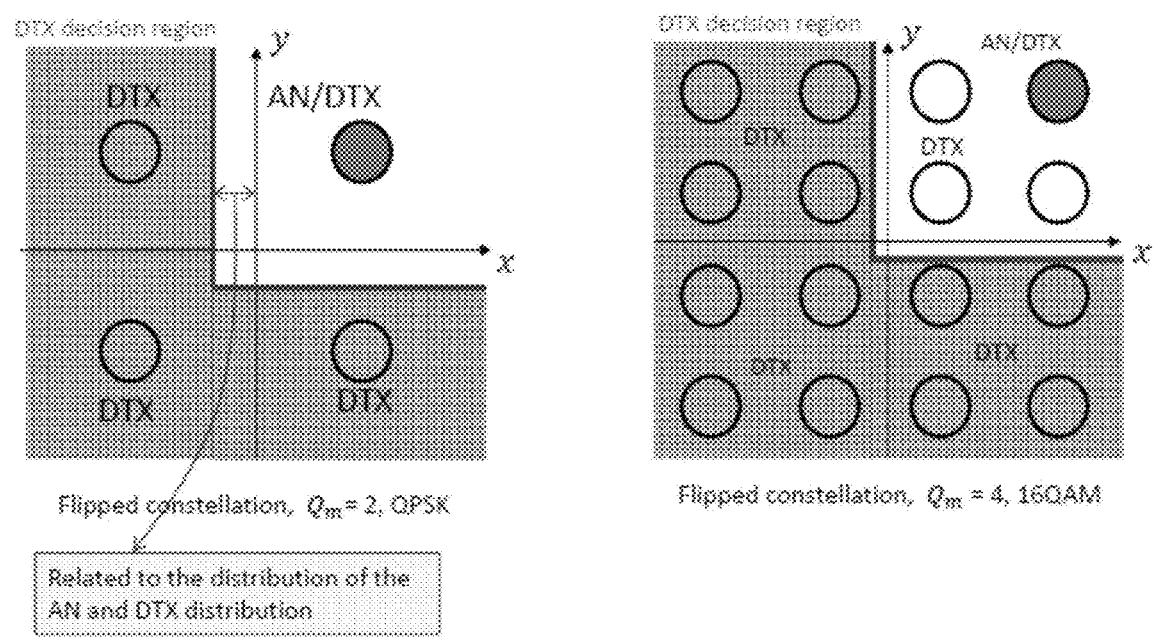
FIG. 10A illustrates DTX decision regions for QSK and 16QAM.

FIG. 10A illustrates a selected or calculated DTX decision region for QPSK and a selected or calculated DTX decision region for 16 QAM. The DTX regions are denoted by shading. In each case, the selected or calculated DTX decision region is smaller than a theoretical DTX decision region. In the case of QPSK, the theoretical region is everything to the left and below the first (upper right) quadrant. In the case of 16 QAM, the theoretical region is anything other than the upper right constellation point in the first (upper right) quadrant.

Figure 10B:
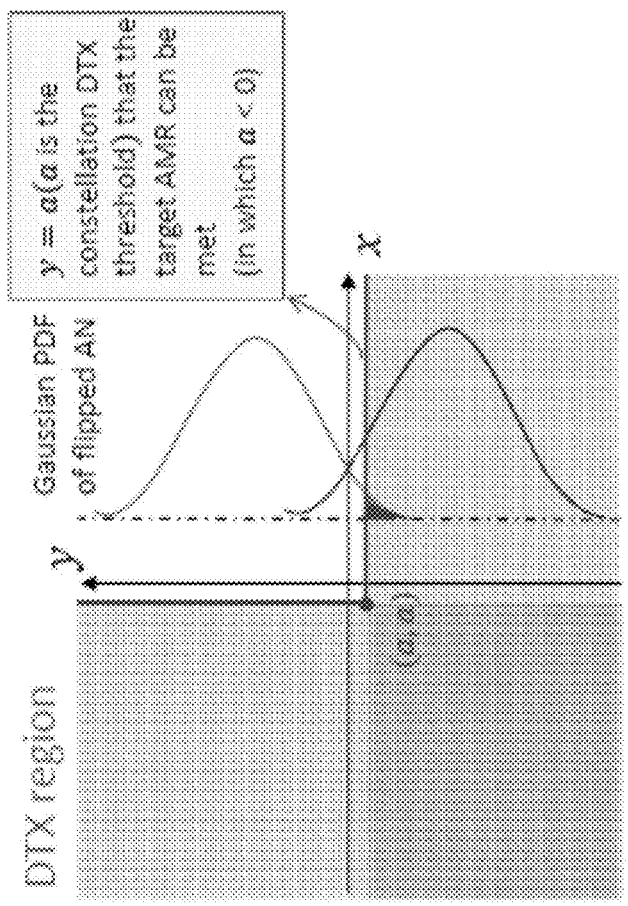
FIG. 10B illustrates the Gaussian power distribution functions (PDFs) of flipped HARQ LLRs demonstrating the derivation of a constellation threshold for the DTX decision regions.
Figure 10B:
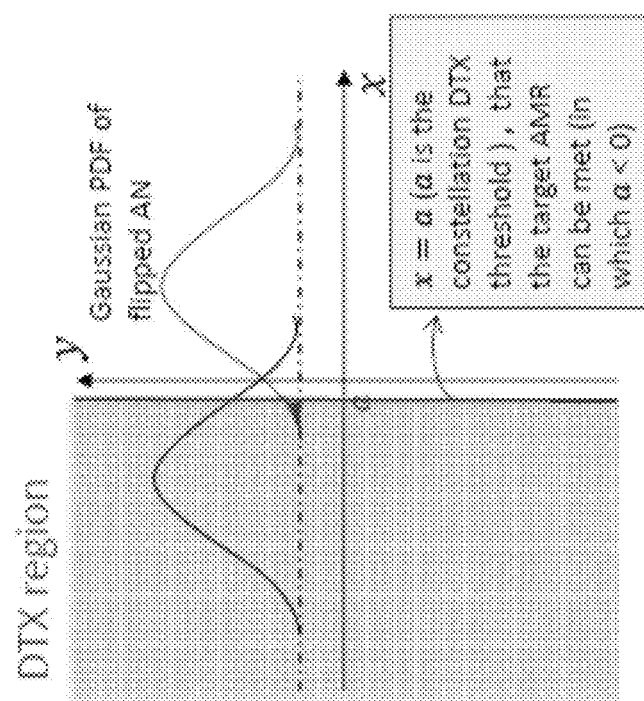

In each of the cases illustrated by FIG. 10A, the selected or calculated DTX decision region is preferably based on a constellation threshold a by which the DTX decision region is spaced a predetermined amount from the first quadrant of the constellation as better illustrated in FIG. 10B where it can be seen that the Gaussian power distributions of ACK/NACK and DTX overlap in both the x and y directions. For the DTX decision region calculation, the DTX region should be within:

$$x < \min(a,0)\ \&\ y < \min(a,0)$$

where where x→$1^{st}$ LLR of the HARQ sample and y→$2^{nd}$ LLR of the HARQ sample,
where $$\alpha = \frac{1}{\sqrt{2}} Q^{-1}\left(\frac{1 - P_{Target\_AMR}}{2}\right)$$

and where $P_{Target\_AMR}$ is a target ACK miss rate (AMR) and $Q^{-1}(\bullet)$ is the inverse Q-function.

The per sample DTX detection module 740 enables the flipped HARQ samples to be used to at least determine DTX and, where the flipped samples do not enable determination of DTX, the ACK/NACK decision can either be confirmed as the output of the decision maker module 720 or preferably be further processed in accordance with the method taught by applicant's prior patent U.S. Pat. No. 8,315,185 and/or by the further methodology described hereinafter.

It will be understood that, if all Q' constellation samples are transmitted into the HARQ decoder 674, the per sample DTX detector module 740 can decide which of the samples are to be determined as DTX if such samples fall in the DTX detection region(s) as described above. If there are total N' samples determined to be DTX, then the DTX per sample rate is $P_{DTX}=N'/Q'$. Consequently, a DTX rate calculation module 750 is provided which receives as its input the DTX detection output of the per sample DTX detection module 740 in order to calculate the DTX per sample rate $P_{DTX}$. This provides additional detection to enhance the DTX detection accuracy. A physical channel uplink signal can be determined to be DTX if $P_{DTX}$ is found to be greater than a predetermined, selected or calculated DTX rate threshold $P_{DTX\_thr}$. For example, if $P_{Target\_AMR}$ is the target AMR and $P_{DTX\_thr}$ is taken to be equal to $P_{Target\_AMR}$ then where $P_{DTX} \leq P_{Target\_AMR}$ the Q' constellation samples are determined to be DTX, otherwise, the decision for the signal can be confirmed as the original ACK/NACK decision $R_{AN}$ to be outputted by the the decision maker module 720 or to proceed to the decision maker module 720 to be processed in accordance with the DTX threshold $X_{Thr'}$ to further determine, i.e. finalize, said ACK/NACK $R_{AN}$ decision as ACK/NACK/DTX.

The decision variable |X| entering the LLR DTX threshold $X_{Thr'}$ is the absolute value of the sum of all the flipped HARQ LLRs:

$$|X|=|\Sigma \text{flipped LLRs}|$$

As indicated, the output of the DTX rate calculation module 750 is fed to the decision maker module 720 for the DTX threshold $X_{Thr'}$ processing step where, if:

$$\begin{cases} |X| \leq XThr'; \text{output } DTX \\ |X| > XThr'; \text{output } ACK/NACK \end{cases}$$

Various DTX thresholds as known from the prior art may be used in the decision maker module 720, but preferably the DTX threshold $X_{Thr'}$ is calculated by the threshold computation module 680 based on the FAR and may take also into account any one or more of the estimated SINR (ESINR), radio bearer (RB) size, and empirical data. The DTX threshold $X_{Thr'}$ is calculated to meet the CFAR. Generally, the DTX threshold $X_{Thr'}$ is calculated as:

$$X_{Thr'} = (\alpha + \delta\beta) * \sqrt{\frac{P}{Q_m}} * \sqrt{Q_{ACK}}$$

where P is the average power of the input bits and $\alpha$ and $\beta$ are the mean standard deviation of the output soft bits.

More specifically, the data soft bits from data-control demultiplexing module 672 that do not contain ACK/NACK are sent to the threshold computation module 680. The threshold computation module 680 computes a power estimate of the random data (that is, data not containing ACK/NACK). For an input, $X_n(i)$, of the i-th soft bit of the n-th data symbol, for i=0 to $Q_m-1$ where $Q_m$ is the modulation level.

Define $\hat{P}_{RD}(i)$ as the random data power estimation for the i-th pair of soft bits of each symbol, for $$i = 0, \ldots, \frac{Q_m}{2} - 1,$$

where $Q_m$ is the modulation level of the data symbol. For example, $\hat{P}_{RD}(0)$ is the sum of the mean powers of the first two bits of the symbol; $\hat{P}_{RD}(1)$ is the sum of the mean powers of the third and fourth bit of the symbols and so on.

$$\hat{P}_{RD}(i) = \frac{1}{2M_{Data}} \sum_{n=0}^{M_{Data}-1} (|X_n(2i)|^2 + |X_n(2i+1)|^2),$$

$$\text{for } i = 0, \ldots, \frac{Q_m}{2} - 1$$

where $M_{Data}$ is the number of data symbols to be used for the random data power estimate.

Using the computed power estimate of the random data, the DTX threshold $X_{Thr'}$ computation is performed. Moreover, the method of DTX threshold $X_{Thr'}$ computation is dependent on M, which ranges from 1 to 4.

(i) Case 1: M=1, without bundling $$X_{Thr'} = \delta\sqrt{\hat{P}_{RD}(0) \cdot Q_{ACK}/2}$$

(ii) Case 1A: M=1, with bundling $$X_{Thr'} = (\alpha + \delta\beta) \cdot \sqrt{\frac{\hat{P}_{RD}(0)}{2}} \cdot \sqrt{Q_{ACK}}$$

where $\alpha=2.0719$ and $\beta=0.8068$ are empirically determined parameters that respectively represent the mean and standard deviation of the output soft metric corresponding to zero-mean and unit variance Gaussian noise input to the decoder and $Q_{ACK}$ is the number of soft bits encoded for HARQ.

(iii) Case 2: M=2

$$X_{Thr'} = (\alpha + \delta\beta) \cdot \sqrt{\frac{\hat{P}_{RD}(0)}{2}} \cdot \sqrt{Q_{ACK}}$$

where $\alpha=1.19$ and $\beta=0.5689$ if bundling is used, and $\alpha=1.8147$ and $\beta=0.5161$ if bundling is not used.

(iv) Case 3: M/>2

$$X_{Thr'} = (\alpha + \delta\beta) \cdot \sqrt{\frac{\sum_{i=0}^{\frac{Q_m}{2}-1} \hat{P}_{RD}(i)}{Q_m}} \cdot \sqrt{Q_{ACK}}$$

where $\alpha$ and $\beta$ are the mean and standard deviation of the output soft metric corresponding to zero-mean and unit variance Gaussian noise input to the decoder:

$$(\alpha, \beta) = \begin{cases} (1.4722, 0.5710) & M = 3 \\ (1.7859, 0.5279) & M = 4 \end{cases}.$$

The values of $\alpha$ and $\beta$ are found by computer simulation using the genuine zero-mean, unit-variance Gaussian random variables as the input of the soft decoder 710, and are pre-programmed into threshold computation module 680. These quantities are the sample mean and variance of the output of the soft decoder 710. The probability density function of the soft decoder output is approximated by Gaussian distribution. Since the soft decoder output samples are independent and identically-distributed (i.i.d.) with respect to one or multiple distributions, under the law of large numbers, the actual distribution of the soft decoder output will approach that of a Gaussian distribution, or the distribution of a sum of Gaussian random variables with different means and variances, which is equal to a Gaussian distribution whose mean is equal to the sum of their means and whose variance is equal to the sum of their variances. As all inputs have zero mean, the mean of the resulting limiting distribution is zero, and the variance is the average variance of those inputs.

It is valid to ignore the fact that the variances of the different bits in a constellation symbol (as in 16 QAM and 64 QAM) are different, since the variance of the limiting distribution does not depend on their individual variances, but on their sum.

And for all decoders, each corresponding to a different number of ACK/NACK information bits, when the input is scaled, the output will be scaled by the same factor. Hence the mean and the standard deviation of the limiting distribution of the soft decoder 710 will also be scaled by the same factor. Accordingly, the threshold is proportional to the square root of the average power of each input bit, which is estimated directly from the data bits contained in some data SC-FDMA symbols. The term, $$\sqrt{\frac{\hat{P}_{RD}(0) + \hat{P}_{RD}(1)}{2}},$$

represents the mean power of each ACK/NACK soft bit, where $\hat{P}_{RD}(i)$ is the estimated power of the i-th bit of the constellation symbol. Moreover, this is proportional to the total number of ACK/NACK bits, since the soft decoder output is always a sum of the input soft bits.

Once the DTX threshold $X_{Thr}$, value is calculated, it is sent to decision-maker module 720 where the absolute value of X, |X|, is compared to $X_{Thr}$. If |X| is greater than or equal to the DTX threshold value $X_{Thr}$, the transmission is determined to be an ACK/NACK transmission and the decoded ACK/NACK bits {ôi} will be passed to a higher layer. If |X| is less that the threshold value $X_{Thr}$, then the transmission is determined to be a DTX transmission.

After ACK/NACK detector 700 has determined whether an ACK, NACK or DTX signal has been transmitted, the decision is passed from the physical (PHY) layer to the medium access control (MAC) layer. Simultaneously, based on this decision ACK/NACK detector 700 will decide whether retransmission of the relevant downlink transport block is required, and schedule accordingly the traffic in the subsequent subframes via the MAC layer.

In preferred embodiments, the DTX threshold $X_{Thr}$, value is therefore calculated by using a power estimate of received random data bits that do not include a reference signal to establish, without involving an estimate of noise in the received random data bits, a value for the FAR based threshold, wherein the received random data bits are received from the physical channel uplink signal and the power estimate is computed according to soft bits corresponding to the received random data bits.

The apparatus described above may be implemented at least in part in software. Those skilled in the art will appreciate that the apparatus described above may be implemented at least in part using general purpose computer equipment or using bespoke equipment.

Here, aspects of the methods and apparatuses described herein can be executed on any apparatus comprising the communication system. Program aspects of the technology can be thought of as "products" or "articles of manufacture" typically in the form of executable code and/or associated data that is carried on or embodied in a type of machine readable medium. "Storage" type media include any or all of the memory of the mobile stations, computers, processors or the like, or associated modules thereof, such as various semiconductor memories, tape drives, disk drives, and the like, which may provide storage at any time for the software programming. All or portions of the software may at times be communicated through the Internet or various other telecommunications networks. Such communications, for example, may enable loading of the software from one computer or processor into another computer or processor. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible non-transitory "storage" media, terms such as computer or machine "readable medium" refer to any medium that participates in providing instructions to a processor for execution.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

It is to be understood that, if any prior art publication is referred to herein, such reference does not constitute an admission that the publication forms a part of the common general knowledge in the art.

The invention claimed is:

1. A method for determining a Hybrid Automatic Repeat Request (HARQ) transmission signal; the method comprising the steps of:
   receiving soft bits from a wireless communication physical channel uplink signal, said received soft bits comprising or being deemed to comprise HARQ Log-Likelihood Ratios (LLRs);
   soft decoding said HARQ LLRs to output a hard Acknowledgement/Negative-Acknowledgement (ACK/NACK) decision;
   flipping said HARQ LLRs by flipping signs of the soft bits of said HARQ LLRs using an expected bit pattern for said hard ACK/NACK decision such that the flipped HARQ LLRs map to a same constellation point or points if the physical channel uplink signal contains an ACK or NACK transmission signal; and
   using said flipped HARQ LLRs to determine if the physical channel uplink signal contains an ACK or NACK transmission signal or to determine if the physical channel uplink signal comprises discontinuous transmission (DTX).

2. The method of claim 1, further comprising the step of determining a decision variable from said flipped HARQ LLRs and determining if the physical channel uplink signal contains an ACK or NACK transmission signal or determining if the physical channel uplink signal comprises DTX by comparing said decision variable with a selected, calculated or predetermined threshold based on a false alarm rate (FAR).

3. The method of claim 2, further comprising the step of using a power estimate of received random data bits that do not include a reference signal to establish, without involving an estimate of noise in the received random data bits, a value for the FAR based threshold, wherein the received random data bits are received from the physical channel uplink signal and the power estimate is computed according to soft bits corresponding to the received random data bits.

4. The method according to claim 1, wherein the HARQ LLRs are processed to output flipped HARQ samples, each comprising two flipped HARQ LLRs.

5. The method of claim 4, further comprising determining if a flipped HARQ sample is DTX by determining if both flipped LLRs of the flipped HARQ sample are less than min(a, 0) where a is a determined, calculated or selected constellation threshold.

6. The method of claim 5, wherein the constellation threshold a is calculated by $$a = \frac{1}{\sqrt{2}} Q^{-1}\left(\frac{1 - P_{Target\_AMR}}{2}\right)$$

where $P_{Target\_AMR}$ is a target ACK miss rate (AMR) and $Q^{-1}(\bullet)$ is the inverse Q-function.

7. The method of claim 4, further comprising the step of calculating a DTX rate ($P_{DTX}$) based on a number of flipped HARQ samples determined to comprise DTX by a per sample DTX detection module over a total number of flipped HARQ samples input to said per sample DTX detection module.

8. The method of claim 7, further comprising the step of determining a DTX decision if $P_{DTX}$ is greater than a per-sample DTX rate threshold, $P_{DTX\_thr}$.

9. The method of claim 8, wherein the per-sample DTX rate threshold $P_{DTX\_thr}$ is equal to a target ACK miss rate, $P_{Target\_AMR}$.

10. The method of claim 8, further comprising determining a final ACK/NACK/DTX decision based on a comparison of a decision variable derived from said flipped HARQ LLRs with a threshold based on a false alarm rate (FAR).

11. The method of claim 10, wherein the final decision comprises DTX where the decision variable is smaller than the FAR based threshold and the final decision comprises the ACK/NACK hard decision when the decision variable is greater than or equal to the FAR based threshold.

12. The method of claim 1, wherein flipping comprises multiplying the HARQ LLR soft bits by the expected bit pattern for the hard ACK/NACK decision.

13. The method of claim 12, wherein the expected bit pattern for the hard ACK/NACK decision is obtained from a previous hard ACK/NACK decision.

14. A receiver for a wireless communication system configured to determine a Hybrid Automatic Repeat Request (HARQ) transmission signal; the receiver comprising:
a soft decoder for:
receiving soft bits from a wireless communication physical channel uplink signal, said received soft bits comprising or being deemed to comprise HARQ Log-Likelihood Ratios (LLRs); and
soft decoding said HARQ LLRs to output a hard Acknowledgement/Negative-Acknowledgement (ACK/NACK) decision;
a HARQ LLR processing module for flipping said HARQ LLRs by flipping signs of the soft bits of said HARQ LLRs using an expected bit pattern for said hard ACK/NACK decision such that the flipped HARQ LLRs map to a same constellation point or points if the physical channel uplink signal contains an ACK or NACK transmission signal; and
a decision module configured to directly or indirectly use said flipped HARQ LLRs to determine if the physical channel uplink signal contains an ACK or NACK transmission signal or to determine if the physical channel uplink signal comprises discontinuous transmission (DTX).

15. The receiver of claim 14, wherein the receiver comprises an eNodeB.

16. A method for determining a Hybrid Automatic Repeat Request (HARQ) discontinuous transmission condition (DTX); the method comprising the steps of:
receiving soft bits from a wireless communication physical channel uplink signal, said received soft bits being deemed to comprise HARQ Log-Likelihood Ratios (LLRs);
soft decoding said HARQ LLRs to output a hard ACK/NACK decision;
flipping said HARQ LLRs by flipping signs of the soft bits of said HARQ LLRs using an expected bit pattern for said hard Acknowledgement/Negative-Acknowledgement (ACK/NACK) decision such that the flipped HARQ LLRs map to a same constellation point or points if the physical channel uplink signal contains an ACK or NACK transmission signal to output flipped HARQ samples, each comprising two flipped HARQ LLRs; and
using said outputted flipped HARQ samples to determine if the physical channel uplink signal comprises DTX.

17. The method of claim 16, wherein the step of using said flipped HARQ samples to determine if the physical channel uplink signal comprises DTX comprises any one or more of:
determining by a per sample DTX detection module if a flipped HARQ sample is DTX by determining if both flipped LLRs of the flipped HARQ sample are less than min(a, 0) where a is a determined, calculated or selected constellation threshold; and
calculating a DTX rate ($P_{DTX}$) based on a number of flipped HARQ samples determined to comprise DTX by said per sample DTX detection module over a total number of flipped HARQ samples input to said per sample DTX detection module and determining a DTX decision if $P_{DTX}$ is greater than a per-sample DTX rate threshold, $P_{DTX\_thr}$.

18. A receiver for a wireless communication system configured to determine a Hybrid Automatic Repeat Request (HARQ) discontinuous transmission condition (DTX); the receiver comprising:
a soft decoder for:
receiving soft bits from a wireless communication physical channel uplink signal, said received soft bits comprising or being deemed to comprise HARQ Log-Likelihood Ratios (LLRs); and
soft decoding said HARQ LLRs to output a hard Acknowledgement/Negative-Acknowledgement (ACK/NACK) decision; and
a HARQ LLR processing module for flipping said HARQ LLRs by flipping signs of the soft bits of said HARQ LLRs using an expected bit pattern for said hard ACK/NACK decision such that the flipped HARQ LLRs map to a same constellation point or points if the physical channel uplink signal contains an ACK or NACK transmission signal to output flipped HARQ samples, each comprising two flipped HARQ LLRs; and using said outputted flipped HARQ samples to determine if the physical channel uplink signal comprises DTX.

19. The receiver of claim 18, wherein the receiver comprises an eNodeB.

\* \* \* \* \*